(12) United States Patent
Kim et al.

(10) Patent No.: US 10,229,908 B2
(45) Date of Patent: Mar. 12, 2019

(54) SEMICONDUCTOR DEVICE INCLUDING A MULTIGATE TRANSISTOR FORMED WITH FIN STRUCTURE

(71) Applicant: SAMSUNG ELECTRONICS CO., LTD., Suwon-si (KR)

(72) Inventors: Sung Min Kim, Incheon (KR); Dong Won Kim, Seongnam-si (KR); Geum Jong Bae, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 15/709,023

(22) Filed: Sep. 19, 2017

(65) Prior Publication Data
US 2018/0342508 A1    Nov. 29, 2018

(30) Foreign Application Priority Data
May 24, 2017    (KR) ........................ 10-2017-0063988

(51) Int. Cl.
*H01L 27/088*    (2006.01)
*H01L 27/02*    (2006.01)
(Continued)

(52) U.S. Cl.
CPC .. *H01L 27/0886* (2013.01); *H01L 21/823431* (2013.01); *H01L 27/0207* (2013.01);
(Continued)

(58) Field of Classification Search
CPC ............. H01L 27/0886; H01L 27/0207; H01L 21/823431; H01L 21/02164; H01L 21/0228; H01L 29/6656
See application file for complete search history.

(56) References Cited

U.S. PATENT DOCUMENTS 7,285,466 B2    10/2007 Kim et al.
8,501,607 B1    8/2013 Juengling
(Continued)

FOREIGN PATENT DOCUMENTS

KR    10-2004-0075566 A    8/2004

OTHER PUBLICATIONS

Search Report dated Jan. 2, 2019 issued by the Singapore Patent Office in counterpart Singapore Application No. 10201804393T.
(Continued)

*Primary Examiner* — Nathan W Ha
(74) *Attorney, Agent, or Firm* — Sughrue Mion, PLLC

(57) ABSTRACT

A semiconductor device is provided. The semiconductor device includes a substrate, a plurality of fins comprising a first fin, a second fin, a third fin, a fourth fin and a fifth fin, each of the plurality of protruding from the substrate in a first direction, and spaced apart from one another in a second direction that intersects the first direction and a plurality of trenches comprising a first trench, a second trench, a third trench and a fourth trench, each of the plurality of trenches being formed between adjacent fins of the plurality of fins, wherein variation of a first width of the first trench and a third width of the third trench is smaller than a first variation, wherein variation of a second width of the second trench and a fourth width of the fourth trench is smaller than a second variation, and wherein the second variation is greater than the first variation.

19 Claims, 8 Drawing Sheets

(51) Int. Cl.
*H01L 21/8234* (2006.01)
*H01L 21/02* (2006.01)
*H01L 29/66* (2006.01)

(52) U.S. Cl.
CPC .... *H01L 21/0228* (2013.01); *H01L 21/02164* (2013.01); *H01L 29/6656* (2013.01)

(56) References Cited

U.S. PATENT DOCUMENTS

| | | | |
|---|---|---|---|
| 8,703,616 B2 | 4/2014 | Wells | |
| 8,946,038 B2 | 2/2015 | Hu et al. | |
| 8,975,094 B2 | 3/2015 | Bello et al. | |
| 9,093,501 B2 | 7/2015 | Singh et al. | |
| 9,171,764 B2 | 10/2015 | Kim et al. | |
| 9,209,038 B2 | 12/2015 | Cantone et al. | |
| 9,257,325 B2 | 2/2016 | Knorr et al. | |
| 9,553,194 B1* | 1/2017 | Licausi | H01L 29/7853 |
| 9,558,956 B2 | 1/2017 | Kim et al. | |
| 9,728,535 B2* | 8/2017 | Youn | H01L 27/0886 |
| 9,947,660 B1* | 4/2018 | Rosenblatt | H01L 27/0886 |
| 2005/0032322 A1 | 2/2005 | Kim et al. | |
| 2014/0097493 A1 | 4/2014 | Baek et al. | |
| 2014/0231919 A1* | 8/2014 | Peng | H01L 21/76224 257/368 |
| 2014/0315371 A1 | 10/2014 | Cai et al. | |
| 2016/0155670 A1 | 6/2016 | Liaw | |
| 2016/0181101 A1 | 6/2016 | Yun et al. | |
| 2016/0203993 A1 | 7/2016 | Zhou et al. | |
| 2016/0307802 A1 | 10/2016 | Lee et al. | |
| 2016/0351663 A1* | 12/2016 | Park | H01L 29/0847 |
| 2017/0012098 A1 | 1/2017 | Park | |
| 2017/0125286 A1* | 5/2017 | Briggs | H01L 21/31055 |
| 2017/0207216 A1* | 7/2017 | Peng | H01L 27/0886 |
| 2017/0213823 A1* | 7/2017 | Cha | H01L 27/0886 |
| 2017/0236756 A1* | 8/2017 | Briggs | H01L 21/823481 438/283 |
| 2017/0294356 A1* | 10/2017 | Yeh | H01L 21/823481 |

OTHER PUBLICATIONS

Written Opinion dated Jan. 2, 2019 issued by the Singapore Patent Office in counterpart Singapore Application No. 10201804393T.

* cited by examiner

FIG. 1
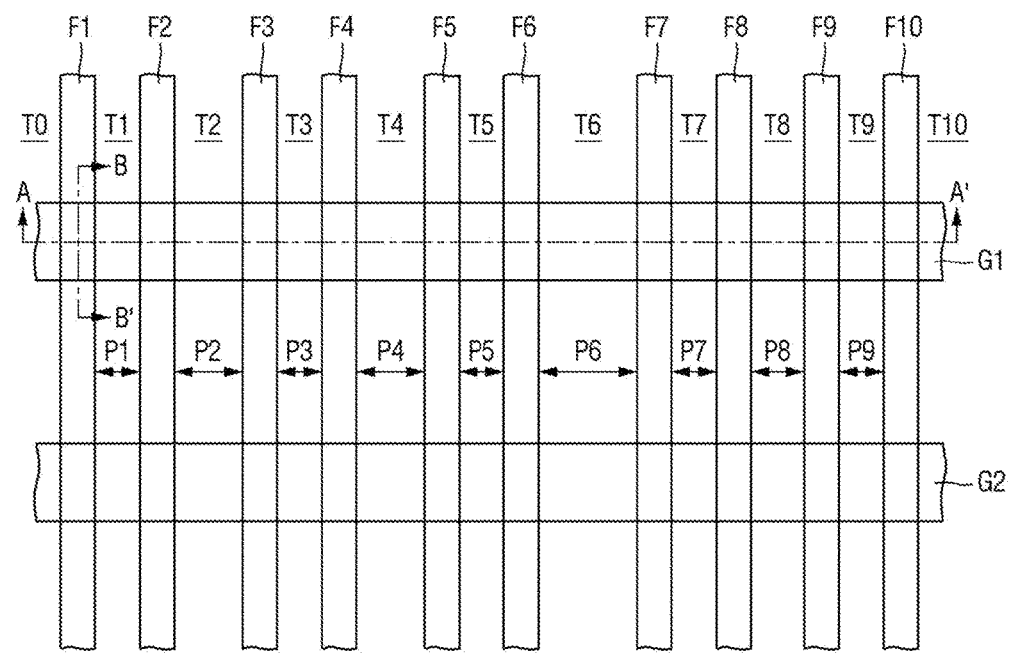
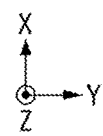

SEMICONDUCTOR DEVICE INCLUDING A MULTIGATE TRANSISTOR FORMED WITH FIN STRUCTURE

CROSS-REFERENCE TO RELATED APPLICATION

This application claims priority from Korean Patent Application No. 10-2017-0063988 filed on May 24, 2017 in the Korean Intellectual Property Office, and all the benefits accruing therefrom under 35 U.S.C. 119, the contents of which are incorporated herein by reference in their entirety.

BACKGROUND

1. Field

Methods and apparatuses consistent with exemplary embodiments to a semiconductor device.

2. Related Art

A multigate transistor has been suggested as one of the scaling technologies to increase density of semiconductor devices, according to which a silicon body in a fin or nanowire shape is formed on a substrate, with gates then being formed on a surface of the silicon body.

Such multigate transistor allows easy scaling, as it uses a three-dimensional channel. Furthermore, current control capability of the multigate transistor may be enhanced without increasing gate length of the multigate transistor. Furthermore, it is possible to effectively suppress short channel effect (SCE) which reduces control capability of the multigate transistor over a channel region in nano-scale semiconductor structure.

SUMMARY

A semiconductor device with improved operation performance is disclosed hereafter.

According to an aspect of an exemplary embodiment, there is provided a semiconductor device including a substrate, a plurality of fins including a first fin, a second fin, a third fin, a fourth fin and a fifth fin, each of the plurality of fins protruding from the substrate in a first direction, and spaced apart from one another in a second direction that intersects the first direction and a plurality of trenches including a first trench, a second trench, a third trench and a fourth trench, each of the plurality of trenches being formed between adjacent fins of the plurality of fins, wherein variation of a first width of the first trench and a third width of the third trench is smaller than a first variation, wherein variation of a first width of the first trench and a third width of the third trench is smaller than a first variation and variation of a second width of the second trench and a fourth width of the fourth trench is smaller than a second variation, and wherein the second variation is greater than the first variation.

According to an aspect of another exemplary embodiment, there is provided a semiconductor device including a substrate, a first fin structure and a second fin structure protruding from the substrate in a first direction, and spaced apart from each other in a second direction that intersects the first direction and a first trench to space the first fin structure and the second fin structure apart from each other, wherein the first fin structure includes a first base fin protruding from the substrate, a first fin and a second fin protruding from the first base fin and spaced apart from each other in the second direction, and a second trench to space the first fin and the second fin part from each other, and wherein the second fin structure includes a second base fin protruding from the substrate.

According to an aspect of yet another exemplary embodiment, there is provided a semiconductor device including a substrate, a first fin structure and a second fin structure protruding from the substrate and extending in a first direction, and spaced apart from each other in a second direction that intersects the first direction and a first trench to space the first fin structure and the second fin structure apart from each other, wherein the first fin structure includes a first base fin protruding from the substrate, a first fin and a second fin protruding from the first base fin and spaced apart from each other in the second direction, and a second trench to space the first fin and the second fin apart from each other, wherein the second fin structure includes a second base fin protruding from the substrate, a third fin protruding from the second base fin, and a third trench to define the third fin with the second trench, and wherein the third trench is formed on the second base fin.

BRIEF DESCRIPTION OF THE DRAWINGS

The above and other objects, features and advantages of the present disclosure will become more apparent to those of ordinary skill in the art by describing in detail exemplary embodiments thereof with reference to the accompanying drawings, in which:

FIG. 1 is a layout diagram provided to explain a semiconductor device according to exemplary embodiments;

DETAILED DESCRIPTION

Hereinbelow, a semiconductor device according to exemplary embodiments will be described with reference to FIGS. 1 to 7.

Figure 2:
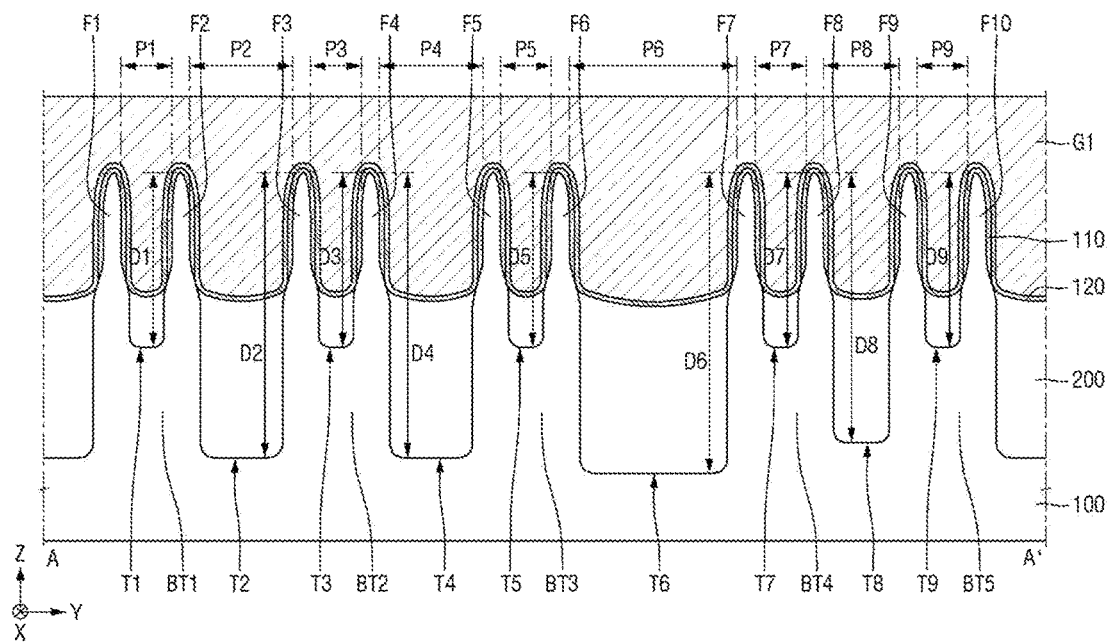
FIG. 2 is a cross-sectional view taken on line A-A' of FIG. 1.
Figure 3:
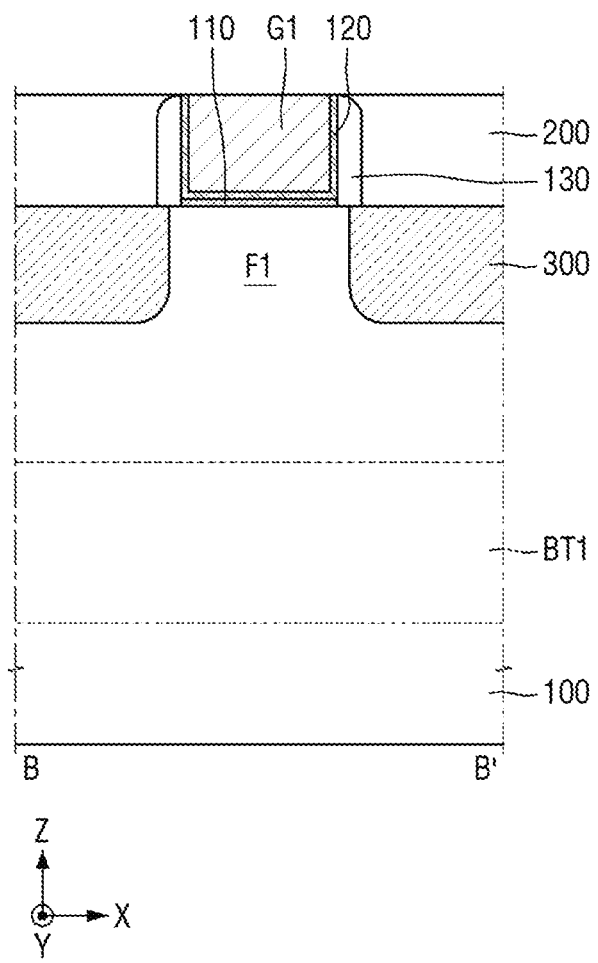
FIG. 3 is a cross-sectional view taken on line B-B' of FIG. 1.
Figure 4:
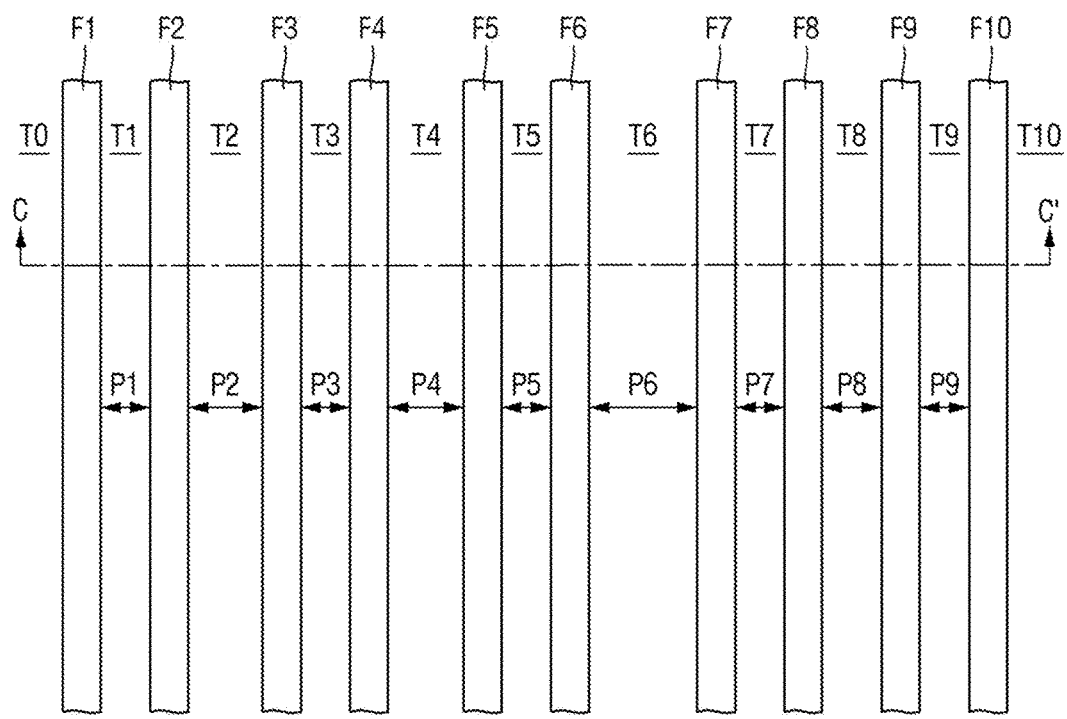
FIG. 4 is a layout diagram provided to explain exemplary embodiments of FIG. 1 in detail.
Figure 5:
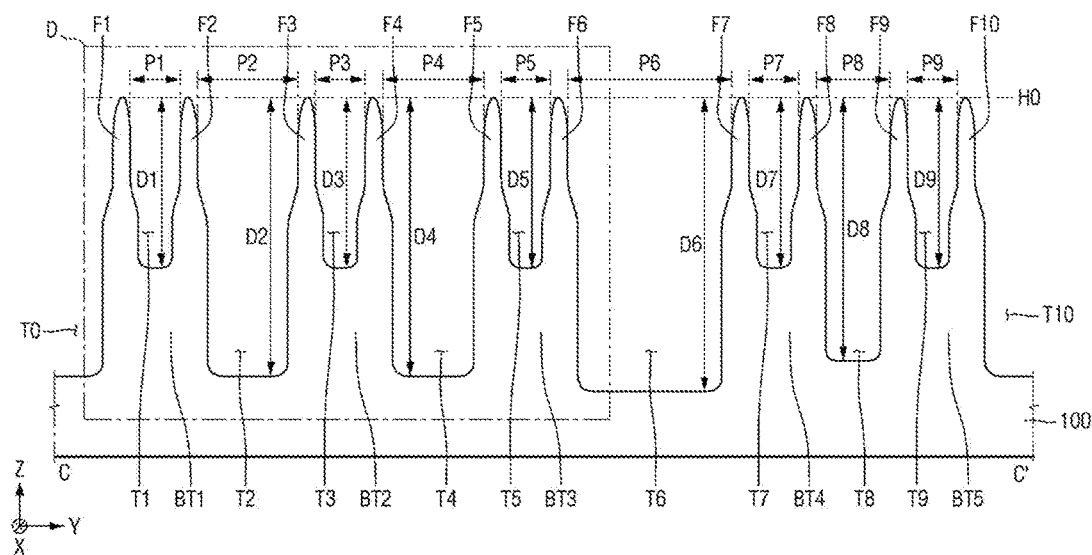
FIG. 5 is a cross-sectional view taken on line C-C' of FIG. 4.
Figure 6:
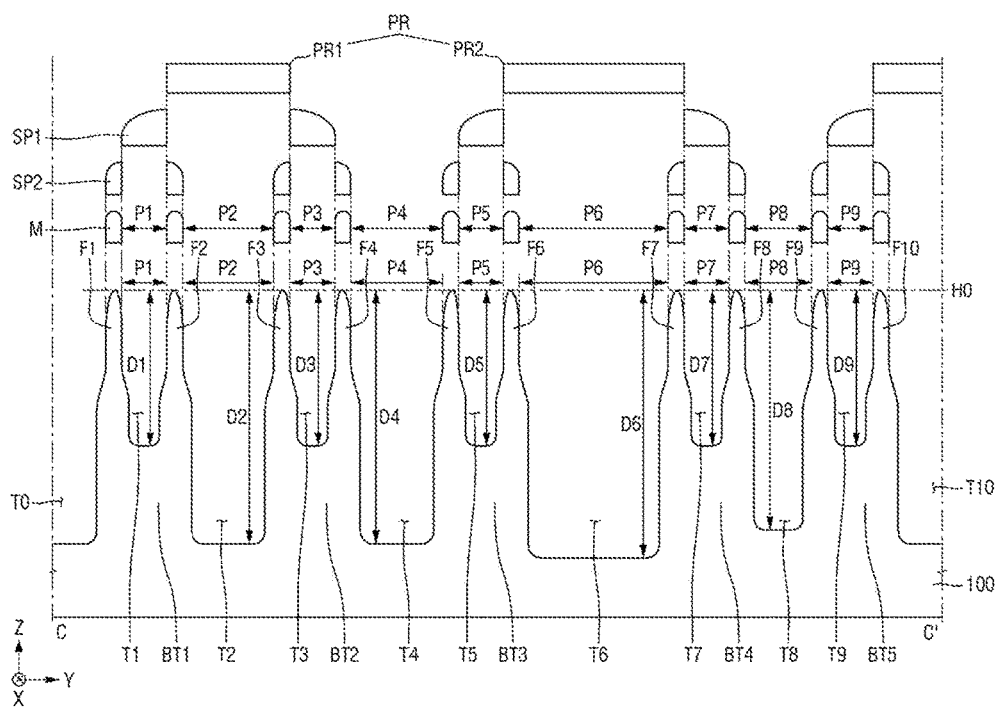
FIG. 6 is a conceptual cross-sectional view provided to explain pitches of fins.
Figure 7:
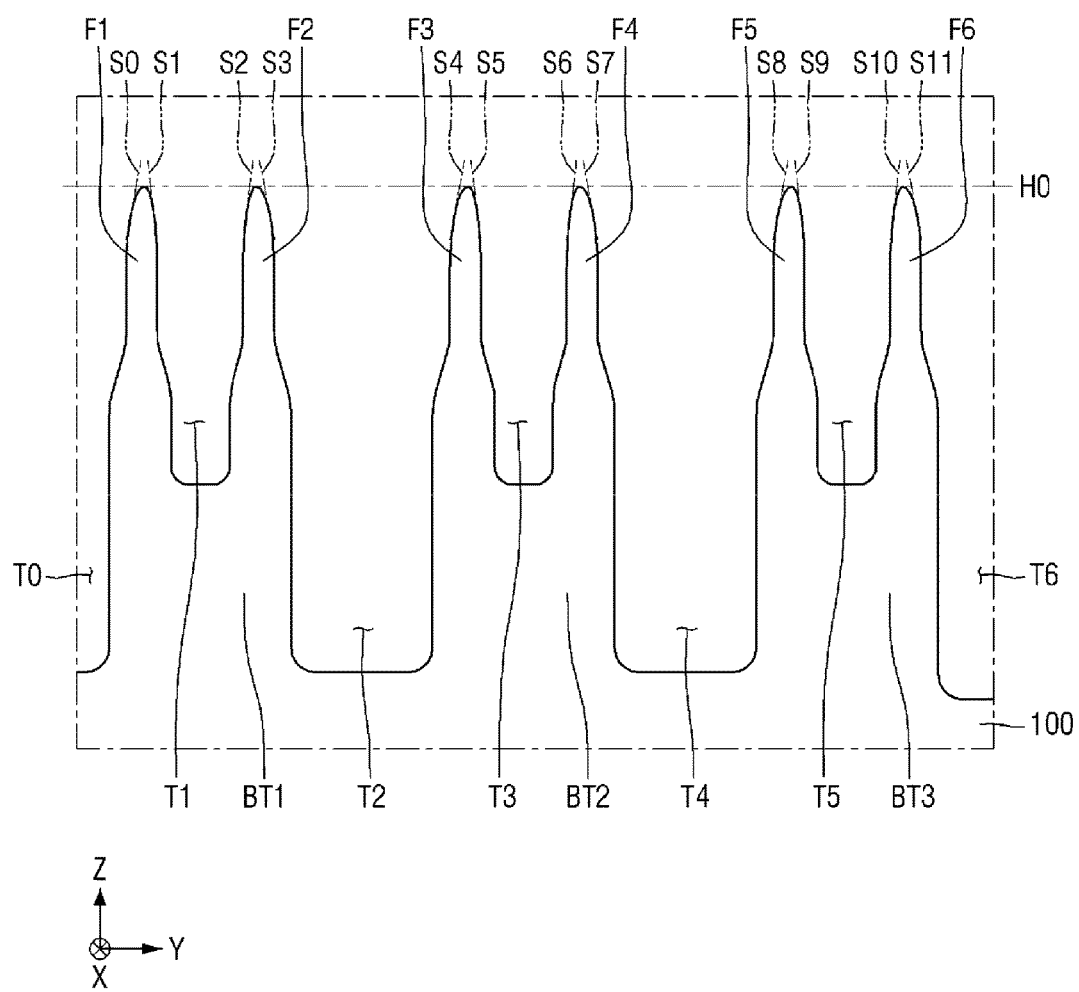
FIG. 7 is an enlarged cross-sectional view provided to explain in detail the sections D of FIG. 2.

FIG. 1 is a layout diagram provided to explain a semiconductor device according to exemplary embodiments, and FIG. 2 is a cross-sectional view taken on line A-A' of FIG. 1. FIG. 3 is a cross-sectional view taken on line B-B' of FIG. 1, and FIG. 4 is a layout diagram provided to explain the exemplary embodiments shown in FIG. 1. FIG. 5 is a cross-sectional view taken on line C-C' of FIG. 4, and FIG. 6 is a conceptual cross-sectional view provided to explain pitches of fins. FIG. 7 is an enlarged cross-sectional view provided to explain in detail the sections D of FIG. 2.

Referring to FIGS. 1 to 5, the semiconductor device according to exemplary embodiments of the present disclosure may include a substrate 100, first to fifth base fins BT1-BT5, first to tenth fins F1-F10, first to eleventh trenches T0-T10, and a first gate electrode G1 and a second gate electrode G2.

The substrate 100 may be formed of one or more semiconductor materials selected from a group consisting of Si, Ge, SiGe, GaP, GaAs, SiC, SiGeC, InAs and InP. Furthermore, a silicon on insulator (SOI) substrate may be used.

The first to tenth fins F1-F10 may protrude from the substrate 100. The first to tenth fins F1-F10 may be a part of the substrate 100, and may include an epitaxial layer grown from the substrate 100. For example, the first to tenth fins F1-F10 may include S1 or SiGe.

The first to tenth fins F1-F10 may include a compound semiconductor, such as IV-IV compound semiconductor or III-V compound semiconductor.

For example, in case of the IV-IV compound semiconductor, the first to tenth fins F1-F10 may be a binary compound or a ternary compound including at least two of carbon (C), silicon (Si), germanium (Ge) and tin (Sn), or these compounds doped with Group IV element.

In case of the III-V compound semiconductor, the first to tenth fins F1-F10 may be any one of a binary compound, a ternary compound, or a quaternary compound formed by combining at least one of the Group III elements which may be aluminum (Al), gallium (Ga) and Indium (In) with one of the Group V elements which may be phosphorous (P), arsenic (As) and antimony (Sb).

In the semiconductor device according to exemplary embodiments, it is assumed that the first to tenth fins F1-F10 include silicon.

The first to tenth fins F1-F10 may extend in a first direction X. The first to tenth fins F1-F10 may be spaced apart from one another in a second direction Y that intersects the first direction X. In this case, the second direction Y may be perpendicular to the first direction X. That is, the first to tenth fins F1-F10 may extend in parallel in the first direction X.

The first to tenth fins F1-F10 may be spaced apart from one another by first to ninth pitches P1-P9 in the second direction Y, respectively. Specifically, the first fin F1 and the second fin F2 may be spaced apart from each other by the first pitch P1 in the second direction Y, and the second fin F2 and the third fin F3 may be spaced apart from each other by the second pitch P2 in the second direction Y.

The third fin F3 and the fourth fin F4 may be spaced apart from each other by the third pitch P3 in the second direction Y, and the fourth fin F4 and the fifth fin F5 may be spaced apart from each other by the fourth pitch P4 in the second direction Y. The fifth fin F5 and the sixth fin F6 may be spaced apart from each other by the fifth pitch P5 in the second direction Y, and the sixth fin F6 and the seventh fin F7 may be spaced apart from each other by the sixth pitch P6 in the second direction Y. The seventh fin F7 and the eighth fin F8 may be spaced apart from each other by the seventh pitch P7 in the second direction Y, and the eighth fin F8 and the ninth fin F9 may be spaced apart from each other by the eighth pitch P8 in the second direction Y. The ninth fin F9 and the tenth fin F10 may be spaced apart from each other by the ninth pitch P9 in the second direction Y.

The second to tenth trenches T1-T9 may be formed between the first to tenth fins F1-F10. In addition, the first trench T0 and the eleventh trench T10 may be formed on a side surface of the first fin F1 and a side surface of the tenth fin F10, respectively. That is, the first to eleventh trenches T0-T10 and the first to tenth fins F1-F10 may be alternately disposed with each other in the second direction Y. That is, the first to tenth fins F1-F10 may be defined by the first to eleventh trenches T0-T10.

Specifically, the first fin F1 may be defined by the first trench T0 and the second trench T1, and the second fin F2 may be defined by the second trench T1 and the third trench T2. The third fin F3 may be defined by the third trench T2 and the fourth trench T3, and the fourth fin F4 may be defined by the fourth trench T3 and the fifth trench T4. The fifth fin F5 may be defined by the fifth trench T4 and the sixth trench T5, and the sixth fin F6 may be defined by the sixth trench T5 and the seventh trench T6. The seventh fin F7 may be defined by the seventh trench T6 and the eighth trench T7, and the eighth fin F8 may be defined by the eighth trench T7 and the ninth trench T8. The ninth fin F9 may be defined by the ninth trench T8 and the tenth trench T9, and the tenth fin F10 may be defined by the tenth trench T9 and the eleventh trench T10.

Widths of the second to tenth trenches T1-T9 may be defined as the first to ninth pitches P1-P9, respectively. That is, the width of the second trench T1 in the second direction Y may be defined as the first pitch P1, and the width of the third trench T2 in the second direction Y may be defined as the second pitch P2. The width of the fourth trench T3 in the second direction Y may be defined as the third pitch P3, and the width of the fifth trench T4 in the second direction Y may be defined as the fourth pitch P4. The width of the sixth trench T5 in the second direction Y may be defined as the fifth pitch P5, and the width of the seventh trench T6 in the second direction Y may be defined as the sixth pitch P6. The width of the eighth trench T7 in the second direction Y may be defined as the seventh pitch P7, and the width of the ninth trench T8 in the second direction Y may be defined as the eighth pitch P8. The width of the tenth trench T9 in the second direction Y may be defined as the ninth pitch P9.

In this case, variations in the widths of the second trench T1, the fourth trench T3, the sixth trench T5, the eighth trench T7, and the tenth trench T9 may be smaller than a first variation. In this case, the term "variation" as used herein means how much a plurality of numerical values differ from one another. That is, differences in the widths between the second trench T1, the fourth trench T3, the sixth trench T5, the eighth trench T7, and the tenth trench T9 may be smaller than the first variation. In other words, a maximum value of the variations in the widths of the second trench T1, the fourth trench T3, the sixth trench T5, the eighth trench T7, and the tenth trench T9 may be the first variation.

Meanwhile, variations in the widths between the third trench T2, the fifth trench T4, the seventh trench T6, and the ninth trench T8 may be smaller than a second variation. That is, differences in the widths between the third trench T2, the fifth trench T4, the seventh trench T6, and the ninth trench T8 may be smaller than the second variation. In other words, a maximum value of the variations in the widths of the third trench T2, the fifth trench T4, the seventh trench T6, and the ninth trench T8 may be the second variation.

In this exemplary embodiments, the second variation may be greater than the first variation. That is, the trenches having relatively small variation in widths and the trenches having relatively large variation in widths may be alternately arranged in the second direction Y.

In addition, the widths of the second trench T1, the fourth trench T3, the sixth trench T5, the eighth trench T7, and the tenth trench T9 may be relatively smaller than the widths of the third trench T2, the fifth trench T4, the seventh trench T6, and the ninth trench T8. Although, the third trench T2, the fifth trench T4, the seventh trench T6, and the ninth trench T8 may have different widths, those widths may all be greater than the widths of the second trench T1, the fourth trench T3, the sixth trench T5, the eighth trench T7, and the tenth trench T9.

Descriptions of the variations in the widths of the second to tenth trenches T1-T9 may be applicable to the first to ninth pitches P1-P9 based on same reasoning. That is, variations of the first pitch P1, the third pitch P3, the fifth pitch P5, the seventh pitch P7, and the ninth pitch P9 may be smaller than the first variation. Likewise, variations of the second pitch P2, the fourth pitch P4, the sixth pitch P6, and the eighth pitch P8 may be smaller than the second variation. Accordingly, the first to tenth fins F1-F10 may be arranged to have different variation in pitches between adjacent fins in which one has relatively small variation and the other has relatively large variation.

In another aspect of the exemplary embodiments, the second to tenth trenches T1-T9, which are defined as first to ninth depths D1-D9 may have depths different from one another. That is, the second trench T1 may have the first depth D1 and the third trench T2 may have the second depth D2. The fourth trench T3 may have the third depth D3 and the fifth trench T4 may have the fourth depth D4. The sixth trench T5 may have the fifth depth D5 and the seventh trench T6 may have the sixth depth D6. The eighth trench T7 may have the seventh depth D7 and the ninth trench T8 may have the eighth depth D8. The tenth trench T9 may have the ninth depth D9.

The variations between the first depth D1, the third depth D3, the fifth depth D5, the seventh depth D7, and the ninth depth D9 may be smaller than a third variation. In other words, maximum variation among the first depth D1, the third depth D3, the fifth depth D5, the seventh depth D7, and the ninth depth D9 may be the third variation.

The variations between the second depth D2, the fourth depth D4, the sixth depth D6, and the eighth depth D8 may be smaller than a fourth variation. In other words, maximum variation among the second depth D2, the fourth depth D4, the sixth depth D6, and the eighth depth D8 may be the fourth variation.

The fourth variation may be greater than the third variation. That is, the trenches having relatively small variation in depth and the trenches having relatively large variation in depth may be alternately arranged in the second direction Y.

Referring to FIGS. 2 and 5, the first to fifth base fins BT1-BT5 may protrude from the substrate 100. The first to fifth base fins BT1-BT5 may be defined by the first trench T0, the third trench T2, the fifth trench T4, the seventh trench T6, the ninth trench T8, and the eleventh trench T10. That is, the first to fifth base fins BT1-BT5 may be spaced apart from one another by the third trench T2, the fifth trench T4, the seventh trench T6, and the ninth trench T9 in the second direction Y.

Specifically, the first base fin BT1 may be defined by the first trench T0 and the third trench T2, and the second base fin BT2 may be defined by the third trench T2 and the fifth trench T4. The third base fin BT3 may be defined by the fifth trench T4 and the seventh trench T6, and the fourth base fin BT4 may be defined by the seventh trench T6 and the ninth trench T8. The fifth base fin BT5 may be defined by the ninth trench T8 and the eleventh trench T10.

The first base fin BT1 may include the first fin F1 and the second fin F2 which protrude from an upper surface thereof, and the second trench T1 which spaces the first fin F1 and the second fin F2 apart from each other. The second base fin BT2 may include the third fin F3 and the fourth fin F4 which protrude from an upper surface thereof, and the fourth trench T3 which spaces the third fin F3 and the fourth fin F4 apart from each other. The third base fin BT3 may include the fifth fin F5 and the sixth fin F6 which protrude from an upper surface thereof, and the sixth trench T5 which spaces the fifth fin F5 and the sixth fin F6 apart from each other. The fourth base fin BT4 may include the seventh fin F7 and the eighth fin F8 which protrude from an upper surface thereof, and the eighth trench T7 which spaces the seventh fin F7 and the eighth fin F8 apart from each other. The fifth base fin BT5 may include the ninth fin F9 and the tenth fin F10 which protrude from an upper surface thereof, and the tenth trench T9 which spaces the ninth fin F9 and the tenth fin F10 apart from each other.

Each of the first to fifth base fins BT1-BT5 may include two fins formed on the upper surface thereof and one trench formed on the upper surface thereof to space the two fins apart from each other. The first to fifth base fins BT1-BT5 may be spaced apart from one another by the second pitch P2, the fourth pitch P4, the sixth pitch P6, and the eighth pitch P8 in the second direction Y.

The first to tenth fins F1-F10 may all have the same height. That is, the first to tenth fins F1-F10 may protrude as high as a first height H0. The term "same" as used herein means "substantially same" and allows process variation including a fine stepped portion that may be formed during process.

The first to ninth depths D1-D9 may refer to distances from the first height H0 to the bottom surfaces of the second to tenth trenches T1-T9 respectively.

The first gate electrode G1 and the second gate electrode G2 may extend in the second direction Y1. The first gate electrode G1 and the second gate electrode G2 may be formed on the first to tenth fins F1-F10.

The first gate electrode G1 and the second gate electrode G2 may be spaced apart from each other in the first direction X. That is, the first gate electrode G1 and the second gate electrode G2 may extend in parallel with each other in the second direction Y.

An interlayer insulating film 200 may partially fill the first to eleventh trenches T0-T10. Because of wide widths of the third trench T2, the fifth trench T4, the seventh trench T6, and the ninth trench T8, the second pitch P2, the fourth pitch P4, the sixth pitch P6, and the eighth pitch P8 may be formed to be relatively wide. The interlayer insulating film 200 which fills the trenches may not be formed to be abnormally high as to swell above the gate.

The interlayer insulating film 200 may be formed on the substrate 100, and may partially cover sidewalls of the first to tenth fins F1-F10 and expose upper portions of the first to tenth fins F1-F10. The interlayer insulating film 200 may include, for example, at least one of silicon oxide, silicon nitride, silicon oxynitride, or a low-k dielectric material with a lower dielectric constant than silicon oxide. For example, the low-k dielectric material may include flowable oxide (FOX), tonen silazene (TOSZ), undoped silica glass (USG), borosilica glass (BSG), phosphosilica glass (PSG), borophosphosilica glass (BPSG), plasma enhanced tetraethyl orthosilicate (PETEOS), fluoride silicate glass (FSG), carbon doped silicon oxide (CDO), xerogel, aerogel, amorphous fluorinated carbon, organo silicate glass (OSG), parylene, bis-benzocyclobutenes (BCB), SILK, polyimide, porous polymeric material, or a combination thereof, but not limited hereto.

Although FIG. 2 illustrates only the cross section of the first gate electrode G1, the second gate electrode G2 may be formed to have same cross section as that of the first gate electrode G1. The cross section of the first gate electrode G1 will be described, and this description is also applicable to the second gate electrode G2.

An interfacial film 110 may be formed between the first to tenth fins F1-F10 and the first gate electrode G1. The interfacial film 110 may be formed by partially oxidizing the first to tenth fins F1-F10. The first to tenth interfacial films 110 may be formed along a profile of the first to tenth fins F1-F10 protruding upward higher than the upper surface of the interlayer insulating film 200. When the first to tenth fins F1-F10 are silicon fin-type patterns including silicon, the first to tenth interfacial films 110 may include a silicon oxide film.

Although FIG. 2 illustrates that the interfacial film 110 is formed along only the upper surfaces of the first to tenth fins F1-F10 rather than along the upper surface of the interlayer insulating film 200, the present disclosure is not limited thereto. Depending on methods of forming the interfacial film 110, the interfacial film 110 may be formed along the upper surface of the interlayer insulating film 200.

A high-k dielectric film 120 may be formed between the interfacial film 110 and the first gate electrode G1. The high-k dielectric film 120 may be formed along the profile of the first to tenth fins F1-F10 protruding upward higher than the upper surface of the interlayer insulating film 200. In addition, the high-k dielectric film 120 may be formed between the first gate electrode G1 and the interlayer insulating film 200.

The high-k dielectric film 120 may be formed along the upper surface of each interfacial film 110 and an inner surface of a spacer 130. Accordingly, a height of an uppermost portion of the high-k dielectric film 120 may be same as a height of an upper surface of the spacer 130.

The high-k dielectric film 120 may include a high-k dielectric material with a higher dielectric constant than a silicon oxide film. For example, the high-k dielectric film 120 may include one or more of silicon oxynitride, silicon nitride, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, or lead zinc niobate, but not limited hereto.

The spacer 130 may be disposed on a sidewall of the first gate electrode G1 extending in the second direction Y. The spacer 130 may include at least one of silicon nitride (SiN), silicon oxynitride (SiON), silicon oxide (SiO$_2$), silicon oxycarbonitride (SiOCN), and a combination thereof.

As exemplified in the drawings, the spacer 130 may be a single film, but it may be a multi-layer spacer in which a plurality of films are stacked. A shape of the spacer 130 and respective shapes of the multi-layer spacer forming the spacer 130 may be I- or L-shape, or a combination thereof depending on the fabrication process or use.

As illustrated in the drawings, the first gate electrode G1 applies a gate voltage to all of the first to tenth fins F1-F10.

Although the first gate electrode G1 and the second gate electrode G2 are each illustrated as a single film, they may be a multi-film. The first gate electrode G1 and the second gate electrode G2 may include a work function adjustment film in contact with the high-k dielectric film 120 and a filling film formed on the work function adjustment film.

In this case, the work function adjustment film functions to adjust a work function of a transistor and may include a work function metal such as TiN, TaN, and TiAlC. The filling film may be a metal film including at least one of W and TiN.

A source/drain 300 may be formed on both sides of the first gate electrode G1. The source/drain 300 may include an epitaxial layer formed by epitaxy process. Further, the source/drain 300 may be an elevated source/drain. The source/drain 300 may be an Si epitaxial layer or a SiC epitaxial layer depending on a conductivity type. In this case, the source/drain 300 may include SiP highly doped with P, or SiPC. Alternatively, the source/drain 300 may include, for example, an SiGe epitaxial layer.

An outer circumference of the source/drain 300 may be at least one of diamond, circle and rectangle shapes.

The first to ninth pitches P1-P9 will be described in connection with a fabrication process of the first to tenth fins F1-F10 with reference to FIG. 6.

The first to tenth fins F1-F10 of the semiconductor device according to exemplary embodiments may be formed by quadruple patterning technique (QPT). That is, a photo resist PR may be formed at the highest stage, a first spacer pattern SP1 may be formed on a side surface of a pattern to which the photo resist PR is transferred, a second spacer pattern SP2 may be formed on a side surface of a pattern to which the first spacer pattern SP1 is transferred, and the first to tenth fins F1-F10 may be formed by a mask pattern M to which the second spacer pattern SP2 is transferred.

In this case, lengths of the photo resists PR in the second direction Y and an arrangement interval therebetween may be calculated in consideration of both a width of the first spacer pattern SP1 in the second direction Y and a width of the second spacer pattern SP2 in the second direction Y, such that the first to ninth pitches P1-P9 are same as one another.

That is, when the mask pattern M is formed to have same pitches, the transferred first to tenth fins F1-F10 may be spaced apart from one another by a same pitch.

In this example, the first spacer pattern SP1 and the second spacer pattern SP2 may be formed by atomic layer deposition (ALD). The first spacer pattern SP1 and the second spacer pattern SP2 may include a silicon oxide film deposited by ALD, but not limited thereto.

Since the first spacer pattern SP1 and the second spacer pattern SP2 are formed by ALD, uniformity of their thicknesses may be relatively very high. Accordingly, the first pitch P1, the third pitch P3, the fifth pitch P5, the seventh pitch P7, and the ninth pitch P9, which are determined according to the thickness of the first spacer pattern SP1, may have relatively very high uniformity. However, a completely same pitch may not be maintained depending on process factors, such as etching in a transferring process. Nevertheless, since the first pitch P1, the third pitch P3, the fifth pitch P5, the seventh pitch P7, and the ninth pitch P9 still maintain high uniformity, they may have variations smaller than the first variation described above.

To the contrary, pitches which are determined by the lengths of the photo resists PR or the interval therebetween may have low uniformity. For example, the second pitch P2 may be determined by the length of the first photo resist PR1, and the fourth pitch P4 may be determined by an interval between the first photo resist PR1 and the second photo resist PR2. In addition, the sixth pitch P6 may be determined by the length of the second photo resist PR2, and the eighth pitch P8 may be determined by an interval between the photo resists PR.

Since such photo resist PR patterns are formed by a photo lithography process, they may have relatively low uniformity. Therefore, variations of pitches formed according to the lengths and the interval of the photo resists PR may be greater than those of pitches formed by transferring an ALD silicon oxide film. Accordingly, pitches may be formed in a range of variations smaller than the second variation which is relatively great as described above.

Accordingly, even when QPT is intended for the first to ninth pitches (P1-P9) to have same values one another, different masking material for forming the first to ninth pitches may make the second pitch P2, the fourth pitch P4, the sixth pitch P6, and the eighth pitch P8 to have relatively lower uniformity than that of the first pitch P1, the third pitch P3, the fifth pitch P5, the seventh pitch P7, and the ninth pitch P9. Consequently, the second pitch P2, the fourth pitch P4, the sixth pitch P6, and the eighth pitch P8 may have smaller values than intended pitches.

When gate electrodes or interlayer insulating films are formed by filling the trenches, a void may be formed where the pitches are relatively narrow depending on the step coverage capability, and heights of the interlayer insulating films may not be uniform, and thus, deposition heights of the gate electrodes formed later may be different from one another depending on pitches formed between trenches.

The void formed during the deposition of the gate electrode may degrade reliability of a work function of the gate electrode, resulting in performance degradation of the semiconductor device.

For example, when the interlayer insulating film is filled to a great depth in relatively small pitched trench, the gate electrode may be formed to have a void which weakens control power of the gate of the fin structure. Because the contract area between the gate and the fin structure may be reduced, the effective channel region area may be reduced.

In addition, ion implantation may be performed on the lower portions of the fins to prevent punch-through between the source and the drain in the fin structure. Because of a distance between the position of the ion implantation and the deposition position of the gate, the ability to prevent punch-through between the source and the drain may be degraded.

Accordingly, in order to prevent a void or punch-through caused from the non-uniform pitches, the semiconductor device according to exemplary embodiments may have greater pitches formed by the photo resist PR, namely, the second pitch P2, the fourth pitch P4, the sixth pitch P6, and the eighth pitch P8, compared to the first pitch P1, the third pitch P3, the fifth pitch P5, the seventh pitch P7, and the ninth pitch P9. This may be achieved by designing the photo resists PR to have greater lengths and interval than conventional designs.

Because the depths of the second to tenth trenches T1-T9, the first to ninth depths D1-D9, may be related with the first to ninth pitches P1-P9, as the first to ninth pitches P1-P9 become greater, the first to ninth depths D1-D9 may become deeper. For example, as illustrated in the drawings, the sixth depth D6 of the seventh trench T6 corresponding to the greatest sixth pitch P6 may be deepest, and the first depth D1, the third depth D3, the fifth depth D5, the seventh depth D7, and the ninth depth D9 corresponding to the smallest pitch, i.e., the first pitch P1, the third pitch P3, the fifth pitch P5, the seventh pitch P7, and the ninth pitch P9 may be shallowest. This phenomenon may be attributable to a kind of loading effect which occurs during etching process wherein the wider are the pitches, the better the etching performance is.

Slopes of the side surfaces of the first to tenth fins F1-F10 will be described with reference to FIG. 7.

Although only the side surfaces of the first to sixth fins F1-F6 are illustrated in FIG. 7, the side surfaces of the seventh to tenth fins F7-F10 may have same slopes. The first fin F1 may have a first slope S0 on a sidewall in contact with the first trench T0, and may have a second slope S1 on a sidewall in contact with the second trench T1. The second fin F2 may have a third slope S2 on a sidewall in contact with the second trench T1, and may have a fourth slope S3 on a sidewall in contact with the third trench T2. The third fin F3 may have a fifth slope S4 on a sidewall in contact with the third trench T2, and may have a sixth slope S5 on a sidewall in contact with the fourth trench T3.

The fourth fin F4 may have a seventh slope S6 on a sidewall in contact with the fourth trench T3, and may have an eighth slope S7 on a sidewall in contact with the fifth trench T4. The fifth fin F5 may have a ninth slope S8 on a sidewall in contact with the fifth trench T4, and may have a tenth slope S9 on a sidewall in contact with the sixth trench T5. The sixth fin F6 may have an eleventh slope S10 on a sidewall in contact with the sixth trench T5, and may have a twelfth slope S11 on a sidewall in contact with the seventh trench T6. In this case, the degree of a slope may be evaluated based on a slope degrees regardless of slope directions.

Variations of the second slope S1, the third slope S2, the sixth slope S5, the seventh slope S6, the tenth slope S9, and the eleventh slope S10, which are the slopes of the sidewalls of the second trench T1, the fourth trench T3, and the sixth trench T5, may be smaller than a fifth variation. In other words, the maximum value of the variations of the second slope S1, the third slope S2, the sixth slope S5, the seventh slope S6, the tenth slope S9, and the eleventh slope S10 may be the fifth variation.

Meanwhile, variations of the first slope S0, the fourth slope S3, the fifth slope S4, the eighth slope S7, the ninth slope S8, and the twelfth slope S11, which are the slopes of the sidewalls of the first trench T0, the third trench T2, the fifth trench T4, and the seventh trench T6, may be smaller than a sixth variation. In other words, the maximum value of the variations of the first slope S0, the fourth slope S3, the fifth slope S4, the eighth slope S7, the ninth slope S8, and the twelfth slope S11 may be the sixth variation.

In this example, the sixth variation may be greater than the fifth variation. That is, the trenches having the slopes in a range of the relatively small fifth variation and the trenches having the slopes in a range of the relatively great sixth variation may be arranged alternately in the second direction Y.

Referring back to FIGS. 2 and 7, the slopes of the sidewalls of the second to tenth trenches T1-T9, including the first to twelfth slopes S0-S11, may depend on the first to ninth pitches P1-P9 described above. As the first to ninth pitches P1-P9 become greater, the slopes of the sidewalls of the corresponding trenches, including the first to twelfth slopes S0-S11, may become smaller. Accordingly, as illustrated in the drawings, the slopes including the twelfth slope S11 of the seventh trench T6 corresponding to the greatest sixth pitch P6 may be smallest, and the slopes including the second slope S1, the third slope S2, the sixth slope S5, the seventh slope S6, the tenth slope S9, and the eleventh slope S10 corresponding to the smallest pitch, i.e., the first pitch P1, the third pitch P3, the fifth pitch P5, the seventh pitch P7, and the ninth pitch P9 may be greatest. This may be attributable to an effect that a diffusion direction of an etchant is limited.

The semiconductor device according to exemplary embodiments may have a stable and uniform configuration by increasing the lengths and the interval of the photo resists in comparison to conventional designs in order to minimize variations of the pitches from intended pitches.

As a result, generation of a void in the fin structure may be prevented and thus operation performance of the semiconductor device may be enhanced.

Hereinbelow, a semiconductor device according to exemplary embodiments will be described with reference to FIGS. 2 and 8. Elements or operations overlapping with exemplary embodiments described above will be mentioned as briefly as possible or omitted for the sake of brevity.

Figure 8:
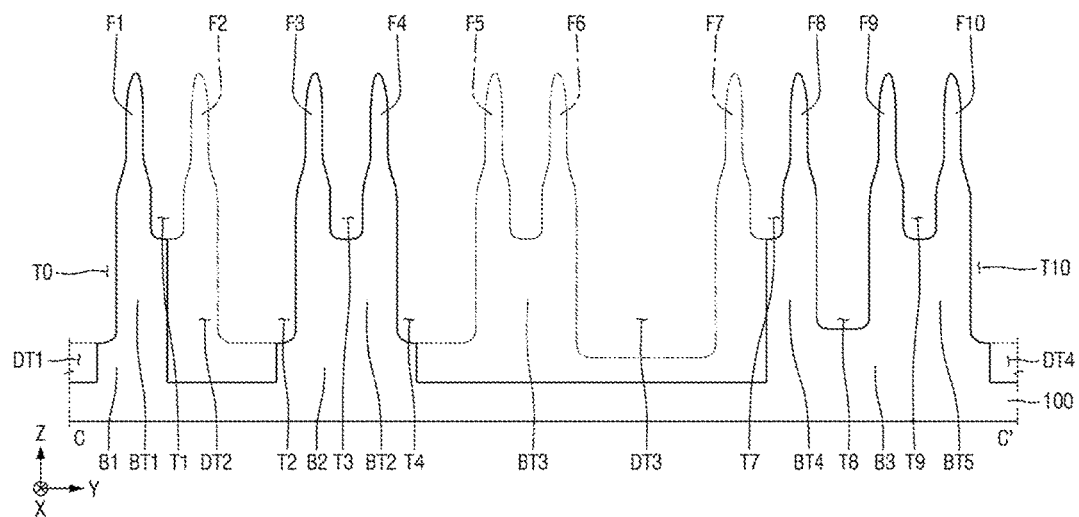
FIG. 8 is a cross-sectional view provided to explain a semiconductor device according to exemplary embodiments.

FIG. 8 is a cross-sectional view provided to explain a semiconductor device according to exemplary embodiments.

Referring to FIGS. 2 and 8, the semiconductor device according to exemplary embodiments may have some fins removed by performing a fin-cut process.

The fin-cut process may be performed for a purpose in a design to fabricate a semiconductor device of a desired scale, and may be performed for a purpose in a process to ensure a space margin because a space margin between adjacent fins is small.

Through such fin-cut process, the semiconductor device according to exemplary embodiments may further include first to fourth deep trenches DT1-DT4 and first to third bases B1-B3. Positions of the first to fourth deep trenches D1-DT4 illustrated in FIG. 8. That is, the number and positions of the first to fourth deep trenches DT1-DT4 may vary according to various purposes.

The first to third bases B1-B3 may be defined by the first to fourth trenches DT1-DT4. That is, the first to third bases B1-B3 may be portions protruding from the substrate 100, and may be distinguished from one another and spaced apart from one another by the first to fourth deep trenches DT1-DT4.

Specifically, the first base B1 may be defined by the first deep trench DT1 and the second deep trench DT2, and the second base B2 may be defined by the second deep trench DT2 and the third deep trench DT3. The third base B3 may be defined by the third deep trench DT3 and the fourth deep trench DT4.

The first base B1 may include the first base fin BT1 on an upper surface thereof, and the second base B2 may include the second base fin BT2 on an upper surface thereof. The third base B3 may include the fourth base fin BT4 and the fifth base fin BT5 on an upper surface thereof. That is, the base fins may protrude from the upper surfaces of the bases.

Comparing FIGS. 2 and 8, the second fin F2, the fifth fin F5, the sixth fin F6, the seventh fin F7, a part of the first base fin BT1, an entirety of the third base fin BT3, and a part of the fourth base fin BT4 may be removed by forming the first to fourth deep trenches DT1-DT4.

Accordingly, the second trench T1 and the third trench T2 may be in contact with the second deep trench DT2, and the fifth trench T4 and the seventh trench T6 may be in contact with the third deep trench DT3. In addition, the eleventh trench T10 may be in contact with the fourth deep trench DT4.

Depths of the first to fourth deep trenches DT1-DT4 may be greater than those of the first to eleventh trenches T0-T10. Accordingly, stepped portions that are convex may be formed at points at which the second trench T1, the third trench T2, the fifth trench T4, the seventh trench T6, and the eleventh trench T10 meet the second to fourth deep trenches DT2-DT4.

The semiconductor device according to exemplary embodiments may prevent degradation of performance caused by a narrow pitch by removing a portion of the fins spaced apart from one another by pitches having great variations. In addition, through such fin-cut process, a layout of the semiconductor device, which is limited to a design having only a multiple number at a certain unit interval according to conventional QPT, may be more freely designed. That is, a limit to the design of the semiconductor device may be reduced, and a factor (e.g., a void, non-uniform deposition of a gate electrode) that may degrade performance in a process may be removed.

Figure 9:
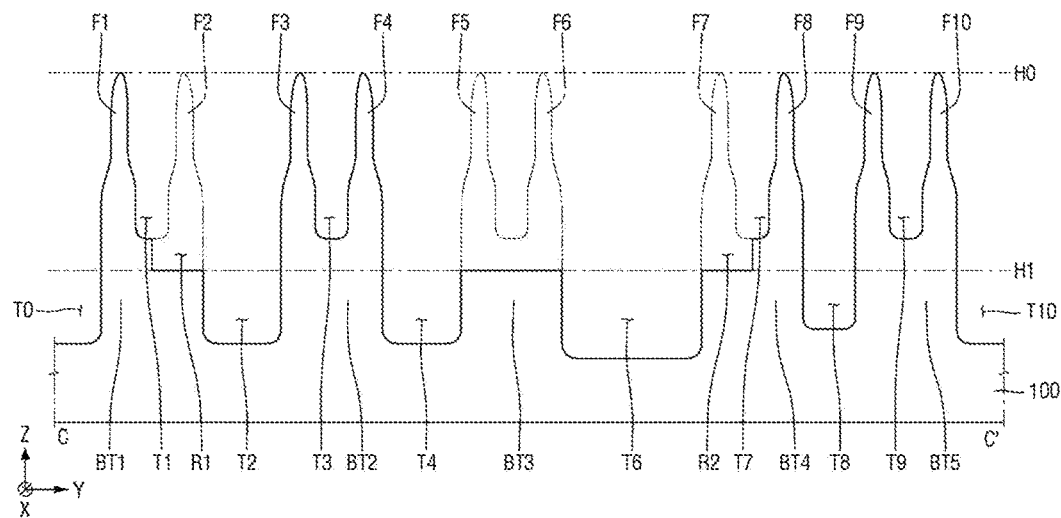
FIG. 9 is a cross-sectional view provided to explain a semiconductor device according to exemplary embodiments.

Hereinbelow, a semiconductor device according to exemplary embodiments will be described with reference to FIGS. 2 and 9. FIG. 9 is a cross-sectional view provided to explain a semiconductor device according to exemplary embodiments.

Referring to FIGS. 2 and 9, the semiconductor device according to exemplary embodiments may perform the fin-cut process at a shallow level of a second height H1.

That is, while the deep trenches of FIG. 8 are deep enough to remove the first to fifth base fins BT1-BT5, the fin-cut process in FIG. 9 may be performed to the extent that only a portion of the first to fifth base fins BT1-BT5 are removed.

Accordingly, only a portion of the upper portions of the first base fin BT1, the third base fin BT3, and the fourth base fin BT4 may be removed and the other portion may be maintained, although the second fin F2, the fifth fin F5, the sixth fin F6, and the seventh fin F7 are likewise removed.

Instead, a first recess R1 may be formed on the first base fin BT1 and a second recess R2 may be formed on the fourth base fin BT4.

Specifically, bottom surfaces of the first recess R1 and the second recess R2 may have the second height H1. The second height H1 may be lower than bottom surfaces of the second trench T1, the fourth trench T3, the sixth trench T5, and the eighth trench T7.

The second trench T1 may be in contact with the first recess R1 on the first base fin BT1, and the eighth trench T7 may be in contact with the second recess R2 on the fourth base fin BT4. Since the first recess R1 and the second recess R2 are formed deeper than the second trench T1 and the eighth trench T7, stepped portions may be formed at positions where the first recess R1 and the second recess R2 are in contact with the second trench T1 and the eighth trench T7, respectively.

The third base fin BT3 may have a flat upper surface since both the fifth fin F5 and the sixth fin F6 are removed. Of course, the flat upper surface of the third base fin BT3 may be lower than the bottom surface of the fourth trench T3.

The semiconductor device according to exemplary embodiments may perform the fin-cut process at the level of the second height H1 which is not relatively low, in order to prevent fins that should not be removed by the fin-cut process from being removed because of a very small scale of the semiconductor device. As a result, damages to the semiconductor devices may be minimized while the fin-cut process is being performed as intended.

Hereinbelow, a semiconductor device according to exemplary embodiments will be described with reference to FIGS. 2 and 10. Elements or operations overlapping with exemplary embodiments described above will be mentioned as briefly as possible or omitted for the sake of brevity.

Figure 10:
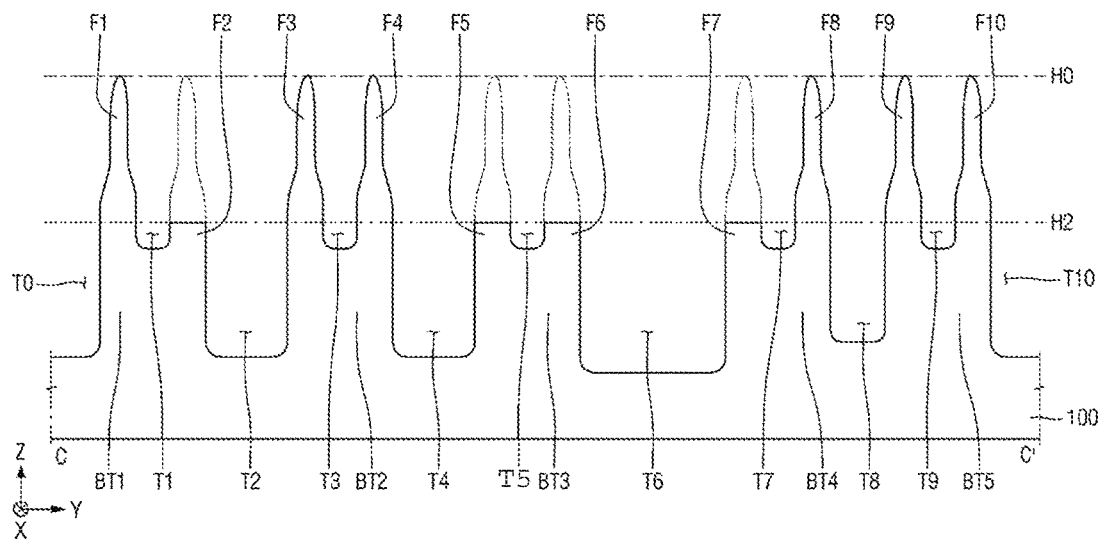
FIG. 10 is a cross-sectional view provided to explain a semiconductor device according to exemplary embodiments.

FIG. 10 is a cross-sectional view provided to explain a semiconductor device according to exemplary embodiments.

Referring to FIGS. 2 and 10, while the fin-cut process in FIG. 9 is performed to the extent that only a portion of the first to fifth base fins BT1-BT5 are removed, the fin-cut process in FIG. 10 may be performed to the extent that the first to fifth base fins BT1-BT5 are not removed and a portion of the first to tenth fins F1-F10 are removed.

Accordingly, only a portion of the second fin F2, the fifth fin F5, the sixth fin F6, and the seventh fin F7 may be removed, while the other portion of the second fin F2, the fifth fin F5, the sixth fin F6, and the seventh fin F7 may be maintained. Accordingly, the second fin F2 may be positioned on the first base fin BT1, the fifth fin F5 and the sixth fin F6 may be positioned on the third base fin BT3, and the seventh fin F7 may be positioned on the fourth base fin BT4.

Heights of the second fin F2, the fifth fin F5, the sixth fin F6, and the seventh fin F7 may be a third height H2. The heights of the second fin F2, the fifth fin F5, the sixth fin F6, and the seventh fin F7 may be same as one another as the third height H2. The term "same" as used herein means "substantially same" and allows process variation including a fine stepped portion that may be formed during the process.

The third height H2 may be higher than the heights of the bottom surfaces of the first to eleventh trenches T0-T10. Accordingly, the second fin F2, the fifth fin F5, the sixth fin F6, and the seventh fin F7 which are partially removed may be maintained.

The semiconductor device according to exemplary embodiments may perform the fin-cut process at the level of the third height H2 which is not relatively low, in order to prevent fins that should not be removed by the fin-cut process from being removed because of a very small scale of the semiconductor device. As a result, the semiconductor device may be designed not to be active by removing the upper portions of the fins, and damages of other structures may be minimized.

What is claimed is:

1. A semiconductor device, comprising:
   a substrate;
   a plurality of fins comprising a first fin, a second fin, a third fin, a fourth fin and a fifth fin, each of the plurality of fins protruding from the substrate in a first direction, and spaced apart from one another in a second direction that intersects the first direction; and
   a plurality of trenches comprising a first trench, a second trench, a third trench and a fourth trench, each of the plurality of trenches being formed between adjacent fins of the plurality of fins,
   wherein variation of a first width of the first trench and a third width of the third trench is smaller than a first variation and variation of a second width of the second trench and a fourth width of the fourth trench is smaller than a second variation,
   wherein the second variation is greater than the first variation, and
   wherein variation of a first depth of the first trench and a third depth of the third trench is smaller than a third variation, and variation of a second depth of the second trench and a fourth depth of the fourth trench is smaller than a fourth variation, and
   wherein the fourth variation is greater than the third variation.

2. The semiconductor device of claim 1, wherein the first width and the third width are smaller than the second width and the fourth width.

3. The semiconductor device of claim 2, wherein the first depth and the third depth are smaller than the second depth and the fourth depth.

4. The semiconductor device of claim 2, wherein a first sidewall slope of the first trench and a third sidewall slope of the third trench are greater than a second sidewall slope of the second trench and a fourth sidewall slope of the fourth trench.

5. The semiconductor device of claim 1, wherein variation between a first sidewall slope of the first trench and a third sidewall slope of the third trench is smaller than a fifth variation,
   wherein variation between a second sidewall slope of the second trench and a fourth sidewall slope of the fourth trench is smaller than a sixth variation, and
   wherein the sixth variation is greater than the fifth variation.

6. The semiconductor device of claim 1, further comprising a gate electrode extending on the first to fifth fins in the second direction.

7. The semiconductor device of claim 1, wherein a height of at least one of the second, third, and fifth fins is lower than that of the first fin.

8. A semiconductor device, comprising:
   a substrate;
   a first fin structure, a second fin structure, and a third fin structure protruding from the substrate in a first direction, and spaced apart from each other in a second direction that intersects the first direction;
   a first trench to space the first fin structure and the second fin structure apart from each other; and
   a fourth trench to space the second fin structure and the third fin structure apart from each other,
   wherein the first fin structure comprises a first base fin protruding from the substrate, a first fin and a second fin protruding from the first base fin and spaced apart from each other in the second direction, and a second trench to space the first fin and the second fin apart from each other,
   wherein the second fin structure comprises a second base fin protruding from the substrate, a third fin and a fourth fin protruding from the second base fin and spaced apart from each other in the second direction, and a third trench to space the third fin and the fourth fin apart from each other,
   wherein variation of a first depth of the first trench and a fourth depth of the fourth trench is smaller than a first variation, and variation of a second depth of the second trench and a third depth of the third trench is smaller than a second variation, and
   wherein the first variation is greater than the second variation.

9. The semiconductor device of claim 8, wherein a third height of the third fin and a fourth height of the fourth fin are lower than a first height of the first fin and a second height of the second fin.

10. The semiconductor device of claim 9, wherein the third height of the third fin and the fourth height of the fourth fin are same as each other.

11. The semiconductor device of claim 8, wherein the second base fin has a flat upper surface.

12. The semiconductor device of claim 11, wherein the flat upper surface of the second base fin is lower than a bottom surface of the first trench.

13. The semiconductor device of claim 8, further comprising a base protruding from the substrate and having the first fin structure, the second fin structure and the first trench formed on an upper surface thereof.

14. A semiconductor device, comprising:
a substrate;
a first fin structure, a second fin structure, and a third fin structure protruding from the substrate and extending in a first direction, and spaced apart from each other in a second direction that intersects the first direction;
a first trench to space the first fin structure and the second fin structure apart from each other; and
a fourth trench to space the second fin structure and the third fin structure apart from each other,
wherein the first fin structure comprises a first base fin protruding from the substrate, a first fin and a second fin protruding from the first base fin and spaced apart from each other in the second direction, and a second trench to space the first fin and the second fin apart from each other,
wherein the second fin structure comprises a second base fin protruding from the substrate, a third fin protruding from the second base fin, and a third trench to define the third fin from the second trench,
wherein the third trench is formed on the second base fin,
wherein variation of a first depth of the first trench and a fourth depth of the fourth trench is smaller than a first variation, and variation of a second depth of the second trench and a third depth of the third trench is smaller than a second variation, and
wherein the first variation is greater than the second variation.

15. The semiconductor device of claim 14, wherein the second fin structure further comprises a fourth fin spaced apart from the third fin on the second base fin in the second direction.

16. The semiconductor device of claim 15, wherein a height of the fourth fin is lower than that of the third fin.

17. The semiconductor device of claim 14, wherein the second base fin further comprises a recess formed on an upper surface of the second base fin,
wherein the third trench is positioned between the recess and the third fin, and
wherein a bottom surface of the recess is lower than the third trench.

18. The semiconductor device of claim 14, further comprising a base protruding from the substrate and having the first fin structure and the second fin structure and the first trench formed on an upper surface thereof, and a first deep trench and a second deep trench to define the base on both sides of the base,
wherein the first fin structure is positioned between the first trench and the second deep trench.

19. The semiconductor device of claim 18, wherein the first deep trench is in contact with a second side surface of the second base fin and a third side surface of the third trench.

* * * * *